United States Patent
Abe et al.

(10) Patent No.: US 7,692,382 B2
(45) Date of Patent: Apr. 6, 2010

(54) IMAGE DISPLAY APPARATUS HAVING A PLURALITY OF PIXELS

(75) Inventors: Shinichi Abe, Shiga (JP); Shinji Takasugi, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 360 days.

(21) Appl. No.: 11/727,097

(22) Filed: Mar. 23, 2007

(65) Prior Publication Data
US 2007/0222377 A1 Sep. 27, 2007

(30) Foreign Application Priority Data
Mar. 27, 2006 (JP) .............................. 2006-085532

(51) Int. Cl.
*H01J 1/62* (2006.01)
(52) U.S. Cl. ...................... 313/506; 313/498
(58) Field of Classification Search .......... 313/498–506
See application file for complete search history.

(56) References Cited

U.S. PATENT DOCUMENTS

| | | | |
|---|---|---|---|
| 6,882,105 B2 | 4/2005 | Murakami et al. | |
| 6,888,520 B2 | 5/2005 | Ouchi et al. | |
| 2005/0117105 A1* | 6/2005 | Kang et al. | 349/143 |

FOREIGN PATENT DOCUMENTS

| | | | |
|---|---|---|---|
| JP | 7-111341 A | | 4/1995 |
| JP | 2002-196704 A | | 7/2002 |
| JP | 2003-20810 A | | 7/2003 |
| JP | 2004-119219 A | | 4/2004 |
| JP | 2004-126121 A | | 4/2004 |
| JP | 2004-191627 A | | 7/2004 |

* cited by examiner

*Primary Examiner*—Joseph L Williams
(74) *Attorney, Agent, or Firm*—Birch, Stewart, Kolasch & Birch, LLP.

(57) ABSTRACT

An image display apparatus includes a plurality of pixels. Each of the pixels includes a light emitting element, a first thin film transistor, and a capacitor. The light emitting element has a light emitting region. The first thin film transistor is arranged outside the light emitting region in plan view. The capacitor is arranged inside the light emitting region in plan view.

8 Claims, 6 Drawing Sheets

☒ CONTACT

IMAGE DISPLAY APPARATUS HAVING A PLURALITY OF PIXELS

CROSS-REFERENCE TO RELATED APPLICATIONS

The present application claims priority under 35 U.S.C. §119 to Japanese Patent Application No. 2006-85532, filed Mar. 27, 2006, entitled "IMAGE DISPLAY APPARATUS." The contents of this application are incorporated herein by reference in their entirety.

BACKGROUND OF THE INVENTION

1. Field of the Invention

The present invention relates to an image display apparatus.

2. Description of the Related Art

Heretofore, in an image display apparatus, e.g., an organic EL display apparatus including a pixel formed by using an organic light emitting diode (OLED), a field-effect thin film transistor or capacitor is used in order to drive the organic light emitting diode.

For example, in a top emission type organic EL display apparatus, since the light of the organic light emitting diode on an element substrate is emitted from the side opposite to the element substrate side, the light is hardly blocked by a circuit layer disposed between the organic light emitting diode and the element substrate. Therefore, in the top emission type organic EL display apparatus, the circuit layer such as thin film transistors and the like can be disposed just below the light emitting region of the organic light emitting diode, and it is said there is an advantage that a wide light emitting region can be ensured.

In the above-described top emission type organic EL display apparatus, for example, in plan view, the thin film transistor is arranged at the center of the inside of the light emitting region of the organic light emitting diode, and the capacitor is arranged in the inside of the light emitting region and in the vicinity of the longer side of the light emitting region (Japanese Unexamined Patent Application Publication No. 7-111341).

According to the above-described known technology, the thin film transistor is arranged at the center of the inside of the light emitting region. However, the surface of the thin film transistor is in a complicated uneven shape as compared with the surface of the capacitor. Consequently, the film thickness of an organic layer constituting the light emitting region becomes nonuniform on the thin film transistor under the influence of the unevenness of the thin film transistor. Furthermore, since the organic layer has a small thickness, there is a problem in that the coverage by the organic layer may become incomplete and, thereby, the productivity of image display apparatus may be decreased.

In addition to the above related art, Japanese Unexamined Patent Application Publication No. 2004-191627 discloses an organic light-emitting display device comprising an organic light emitting element, a thin film transistor for driving the organic light emitting element, and a capacitor connected to the thin film transistor. In the organic light-emitting display device, the thin film transistor is arranged outside the organic light emitting element in plan view and the capacitor is arranged inside and outside the organic light emitting element in plan view.

Japanese Unexamined Patent Application Publication No. 2004-119219 discloses an active matrix type organic EL display comprising an organic EL element, a driving transistor, and a capacitor. In the active matrix type organic EL display, the driving transistor is arranged inside the organic EL element in plan view and the capacitor is arranged inside and outside the organic EL element in plan view.

Japanese Unexamined Patent Application Publication No. 2004-126121 discloses an organic EL display device comprising an organic EL element and a switch circuit having a low-temperature poly-silicon transistor for driving, a low-temperature poly-silicon transistor for addressing, and a capacitor. In the organic EL display device, the transistors and the capacitor which constitute the switch circuit are arranged inside the organic EL element in plan view.

Japanese Unexamined Patent Application Publication No. 2003-208109 discloses an active matrix type display device comprising an organic LED element, a transistor for driving the organic LED element, and a capacitor. In the active matrix type display device, the transistor is arranged inside the organic LED element in plan view and the capacitor is arranged inside and outside the organic LED element in plan view.

SUMMARY OF THE INVENTION

According to an aspect of the present invention, an image display apparatus includes a plurality of pixels. Each of the pixels includes a light emitting element, a first thin film transistor, and a capacitor. The light emitting element has a light emitting region. The first thin film transistor is arranged outside the light emitting region in plan view. The capacitor is arranged inside the light emitting region in plan view.

DESCRIPTION OF THE PREFERRED EMBODIMENTS

An image display apparatus according to an embodiment of the present invention will be described below in detail with reference to the drawings. The present invention is not limited to the following description. Modifications can be made appropriately within the scope of the present invention.

An image display apparatus according to the present embodiment relates to an organic EL display apparatus including a plurality of pixels which is supported by an element substrate. Each of the pixels includes a top emission type organic EL element, a driving thin film transistor for driving the organic EL-element, and a capacitor. In the above-described organic EL display apparatus, an insulating layer is formed to cover the driving thin film transistor and the capacitor disposed on the element substrate, and the organic EL element is disposed on the insulating layer.

Figure 1A:
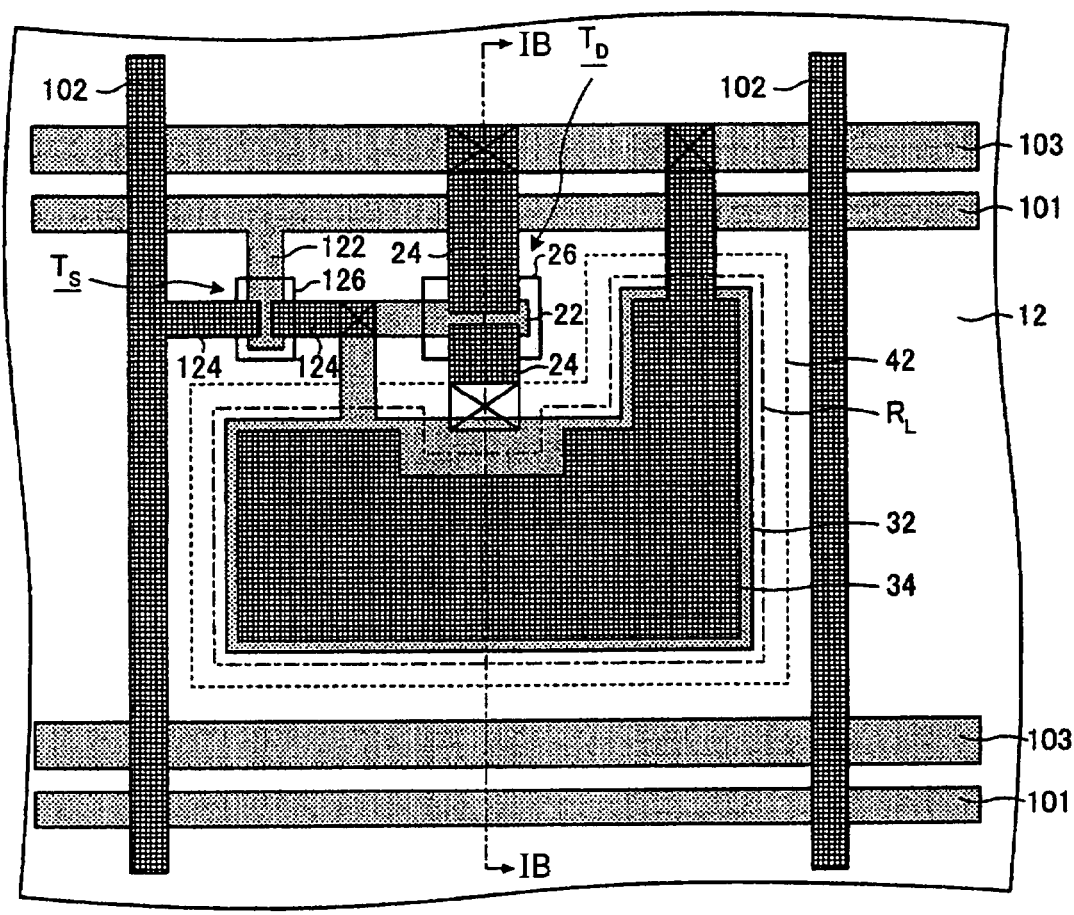
FIG. 1A is a plan view for explaining the schematic configuration of the pixel region in an organic EL display apparatus according to an embodiment.
Figure 1B:
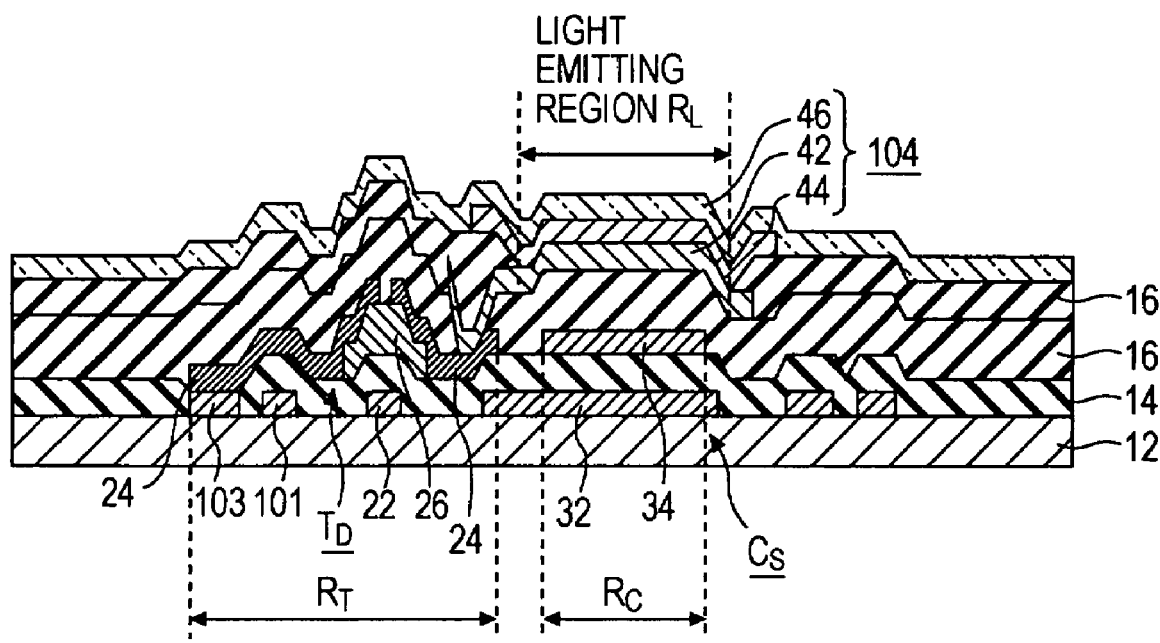
FIG. 1B is a sectional view taken along a line IB-IB in FIG. 1A for explaining the schematic configuration of the pixel region in the organic EL display apparatus according to the embodiment.
Figure 1C:
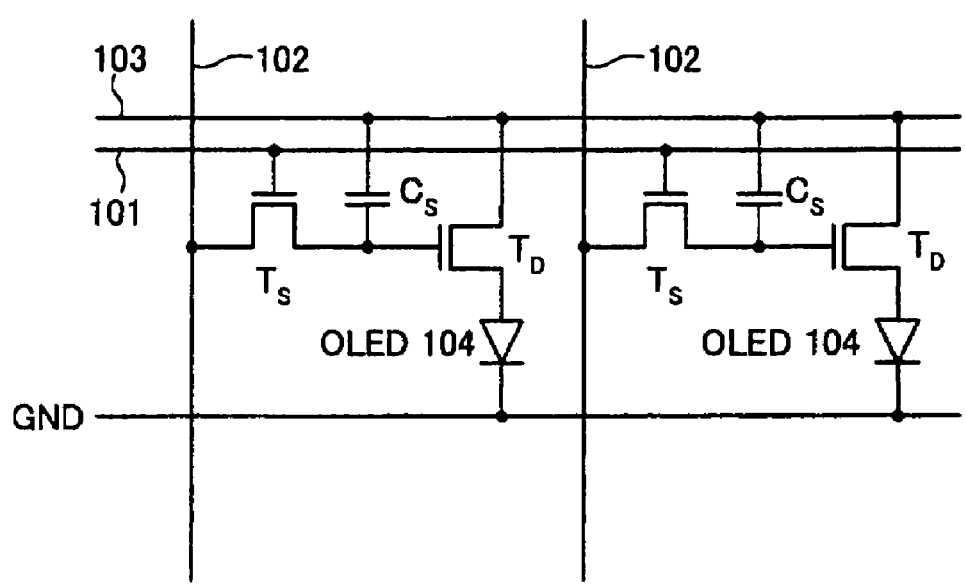
FIG. 1C is an equivalent circuit diagram of the pixel region in the organic EL display apparatus according to the embodiment.

FIG. 1A to FIG. 1C are diagrams for explaining the schematic configuration of the organic EL display apparatus according to the present embodiment. FIG. 1A is a plan view for explaining the schematic configuration of the pixel region in the organic EL display apparatus according to the present embodiment. FIG. 1B is a sectional view for explaining the schematic configuration of the pixel region in the organic EL display apparatus according to the present embodiment, and is a diagram of a section taken along a line IB-IB shown in FIG. 1A.

Here, FIG. 1A is a diagram viewed through an insulating layer 16 and elements (except the organic layer 42) positioned on the side nearer to the organic layer than the insulating layer 16, which are clear from the sectional view shown in FIG. 1B. FIG. 1C is an equivalent circuit diagram of the pixel region in the organic EL display apparatus according to the present embodiment. For the sake of understanding, scales of individual components may be different depending on the drawings, or some components may be omitted from the drawings.

The circuit structure of the pixel region of the organic EL display apparatus according to the present embodiment will be described. As illustrated in FIG. 1C, the organic EL display apparatus has a configuration in which a scanning line 101, a signal line 102 extending in a direction intersecting the scanning line 101 at a nearly right angle in the plan view, and a power supply line 103 extending nearly parallel to the scanning line 101 are arranged independently. As illustrated in FIG. 1A, a pixel region is disposed in a region surrounded by the scanning line 101, the signal lines 102, and the power supply line 103. A plurality of the pixel regions is disposed on the element substrate, while being arranged in the matrix.

Each pixel region includes a switching thin film transistor $T_S$ having a gate to which a scanning signal is supplied through the scanning line 101, a capacitor $C_S$ for holding an image signal supplied from the signal line 102 through the switching thin film transistor $T_S$, a driving thin film transistor $T_D$ having a gate to which the image signal held by the capacitor $C_S$ is supplied, and an organic EL element (OLED) 104.

The organic EL element (OLED) 104 is configured to include a pixel electrode (anode), into which a driving current passes from the power supply line 103 when the organic EL element (OLED) 104 is electrically connected to the power supply line 103 through the driving thin film transistor $T_D$, a counter electrode (cathode) disposed opposing to the pixel electrode, and an organic layer sandwiched between the pixel electrode (anode) and the counter electrode (cathode).

In the organic EL display apparatus having the above-described circuit structure, according to the present embodiment, when the scanning line 101 supplies the scanning signal to the switching thin film transistor $T_S$ and the switching thin film transistor $T_S$ is turned on, the potential of the signal line 102 at that time is held by the capacitor $C_S$, and the conduction state of the driving thin film transistor $T_D$ is controlled in accordance with the state of the capacitor $C_S$. Thereafter, a current passes from the power supply line 103 into the organic EL element (OLED) 104 through a channel of the driving thin film transistor $T_D$. The organic layer of the organic EL element (OLED) 104 emits light in accordance with the amount of current.

A specific structure of the organic EL display apparatus according to the present embodiment will be described.

As illustrated in FIG. 1A to 1C, in the organic EL display apparatus according to the present embodiment, circuit layers 22, 32, 101, 103, and 122, which include various circuits, are disposed on the element substrate 12. Furthermore, an insulating layer 14 is disposed on the circuit layers 22, 32, 101, 103, and 122. The organic EL element 104 is disposed on the insulating layer 14.

The circuit layer 22 constitutes a gate layer 22 of the driving thin film transistor $T_D$. The circuit layer 32 constitutes an electrode of the capacitor $C_S$. The circuit layer 101 constitutes the scanning line 101. The circuit layer 103 constitutes the power supply line 103. The circuit layer 122 constitutes the gate layer 122 of the switching thin film transistor $T_S$.

The driving thin film transistor $T_D$ is configured to include the gate layer 22 disposed on the element substrate 12, the insulating layer 14 disposed on the gate layer 22, a source-drain layer 24 disposed on the insulating layer 14, and a semiconductor layer 26 sandwiched between the source-drain layer 24 and the insulating layer 14. The thicknesses of the gate layer 22, the insulating layer 14, and the source-drain layer 24 are set at, for example, 200 nm to 500 nm. The thickness of the semiconductor layer 26 is set at, for example, 50 nm to 200 nm.

The materials to be used for the gate layer 22, the insulating layer 14, the source-drain layer 24, and the semiconductor layer 26 may be known materials as the constituent materials of the thin film transistor (for example, the material for the gate layer 22 and the source-drain layer 24 is a metal material, e.g., Al or an alloy thereof, the material for the insulating layer 14 is an insulating material, e.g., $SiN_x$, $SiO_2$, or a mixture thereof, and the material for the semiconductor layer 26 is a semiconductor material, e.g., a-Si or p-Si).

The thin film transistor $T_S$ is configured to include the gate layer 122 disposed on the element substrate 12, the insulating layer 14 disposed on the gate layer 122, a source-drain layer 124 disposed on the insulating layer 14, and a semiconductor layer 126 sandwiched between the source-drain layer 124 and the insulating layer 14. The thicknesses of the gate layer 122, the source-drain layer 124, and the semiconductor layer 126 are the values substantially within the same range as the thicknesses of those of the thin film transistor $T_D$.

The materials to be used for the gate layer 122, the source-drain layer 124, and the semiconductor layer 126 may be known materials as constituent materials of the thin film transistor. Since the thin film transistor $T_S$ is preferably formed at approximately the same time when the thin film transistor $T_D$ is formed, it is preferable that the thin film transistor $T_S$ be formed from the same material as the material for the thin film transistor $T_D$.

The capacitor $C_S$ is composed of a lower electrode 32 disposed on the element substrate 12, the insulating layer 14 disposed on the lower electrode 32, and an upper electrode 34 disposed on the insulating layer 14. The thickness of the lower electrode 32 is set to the value substantially within the same range as the thickness of the gate layer 22 of the thin film transistor $T_D$. The thickness of the upper electrode 34 is set to the value substantially within the same range as the thickness of the source-drain layer 24 of the thin film transistor $T_D$. The materials to be used for the lower electrode 32, the insulating layer 14, and the upper electrode 34 may be known materials as constituent materials of the capacitor. Since the lower electrode 32, the insulating layer 14, and the upper electrode 34 are preferably formed at approximately the same time when the gate layer 22, the insulating layer 14, and the source-drain layer 24 of the thin film transistor $T_D$ are formed, it is preferable that they be formed from the same materials, respectively.

The basic structure of the organic EL element 104 is a structure in which the organic layer 44 is sandwiched between the lower electrode 42 corresponding to the above-described pixel electrode and the upper electrode 46 corresponding to the above-described counter electrode. The lower electrode 42 is covered with an insulating layer 16 except a light emitting region and the vicinity thereof. In general, in many cases, the lower electrode 42 disposed on the element substrate 12 serves as an anode, and the upper electrode 46 disposed opposing to the lower electrode 42 with the organic layer 44 therebetween serves as a cathode. However, as a matter of course, the lower electrode 42 may serve as a cathode, and the upper electrode 46 may serve as an anode. The upper electrode 46 may be a transparent or translucent electrode so as to transmit the light. In many cases, the organic layer 44 is composed of a plurality of layers including a hole injection layer, a hole transportation layer, a light emitting layer, an electron transportation layer, an electron injection layer, and the like. However, the layers other than the light emitting layer may be omitted. The thus configured organic EL element 104 has a light emitting region $R_L$, as illustrated in FIG. 1B.

The thicknesses of the lower electrode 42, the organic layer 44, and the upper electrode 46 are set at within the range of, for example, 200 nm to 500 nm, 50 nm to 200 nm, and 10 nm to 50 nm, respectively. The materials to be used for the lower electrode 42, the organic layer 44, and the upper electrode 46 may be known materials for the organic EL element (for example, the material for the lower electrode 42 is a metal material, e.g., Al, Ag, or an alloy thereof, which reflects the light, the material for the organic layer 44 is an organic material, e.g., CuPc, NPB, Alq$_3$, or a mixture thereof, and the material for the upper electrode 46 is Li, Mg, Ca, Al, Ag, or a mixture thereof). At least one of the lower electrode 42, the organic layer 44, and the upper electrode 46 may be a multilayer structure in which the above-described materials are layered.

In the organic EL display apparatus, which is configured as described above, according to the present embodiment, each pixel includes an organic EL element having a light emitting region, a thin film transistor $T_D$ arranged outside the light emitting region, for driving the organic EL element, and a capacitor $C_S$ arranged inside the light emitting region and electrically connected to the gate layer of the thin film transistor $T_D$.

That is, in the present embodiment, when viewed from a direction perpendicular to the element substrate 12, a region $R_T$ for forming the driving thin film transistor $T_D$ is arranged outside the light emitting region $R_L$ of the organic EL element and is arranged at a position completely out of the light emitting region $R_L$.

Furthermore, in the present embodiment, when viewed from a direction perpendicular to the element substrate 12, a region for forming the switching thin film transistor $T_S$ is also arranged outside the light emitting region $R_L$ of the organic EL element and is arranged at a position completely out of the light emitting region $R_L$. The driving thin film transistor $T_D$ is formed in a region $R_T$ in which a semiconductor layer is opposed to a gate layer or a source-drain layer. The switching thin film transistor $T_S$ is formed in a region $R_S$ in which the semiconductor layer is opposed to the gate layer or the source-drain layer.

Figure 2:
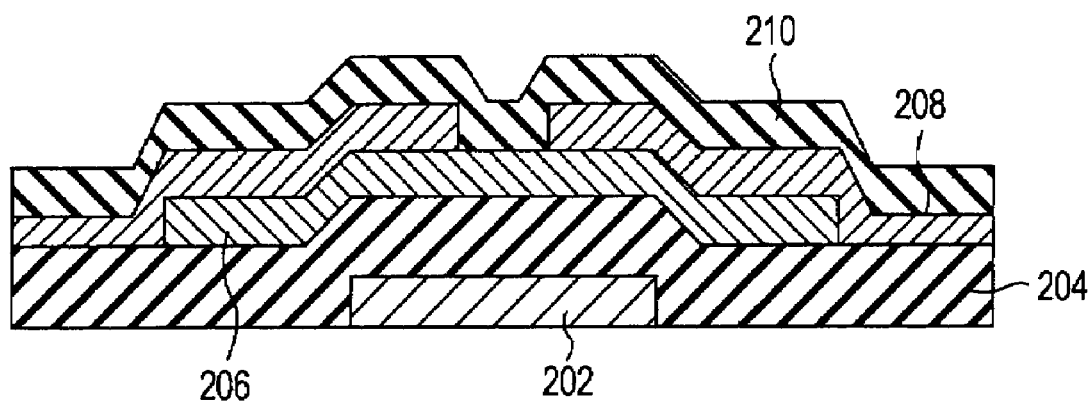
FIG. 2 is a sectional view for explaining the shape of a thin film transistor.
Figure 3:
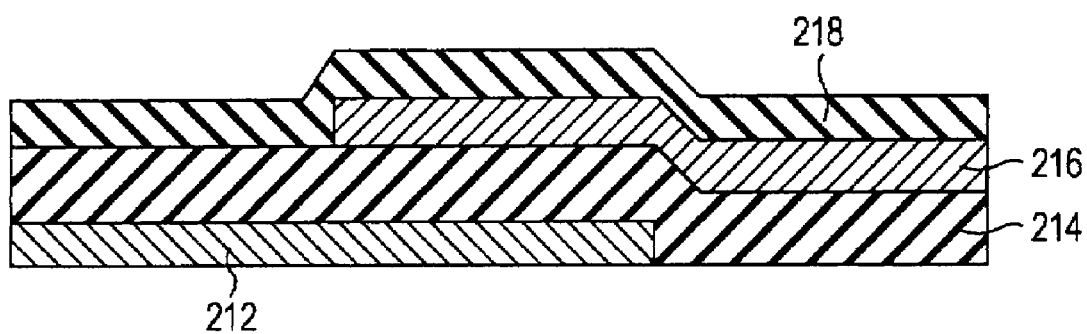
FIG. 3 is a sectional view for explaining the shape of a capacitor.

The surface of the thin film transistor is in a complicated uneven shape as compared with the surface of the capacitor. The thin film transistor has a structure in which a gate layer 202, an insulating layer 204, a semiconductor layer 206, a source-drain layer 208, and an insulating layer 210 disposed thereon are layered, as illustrated in FIG. 2, for example. The capacitor is composed of a lower electrode 212, an insulating layer 214, an upper electrode 216, and an insulating layer 218 disposed thereon, as illustrated in FIG. 3, for example. FIG. 2 is a sectional view for explaining the shape of a thin film transistor. FIG. 3 is a sectional view for explaining the shape of a capacitor.

As described above, the thin film transistor has constituent components more than those of the capacitor, and the pattern of the source-drain layer 208 is complicated as compared with the pattern of the upper electrode 216 of the capacitor and, therefore, the uneven pattern is also complicated. As a result, the entire thin film transistor has a complicated shape as compared with the shape of the capacitor, and the shape of the top surface thereof includes significant height difference (unevenness).

Consequently, in the case where the thin film transistor is disposed in the light emitting region of the organic EL element, the influence of the above-described unevenness is exerted, the organic layer constituting the light emitting region may not completely cover the uneven region and, thereby, short circuit may occur between the lower electrode and the upper electrode in a region in which the organic layer is not disposed.

In the present embodiment, the thin film transistor having the complicated surface shape as compared with that of the capacitor is arranged outside the light emitting region of the organic EL element. Consequently, since no thin film transistor is present under the light emitting region, variations in film thickness of the organic layer resulting from height difference (unevenness) taking the complicated shape of the thin film transistor and an occurrence of short circuit between the lower electrode and the upper electrode in a region in which the organic layer is not disposed decrease satisfactorily, and an improvement of the productivity of the image display apparatus can be facilitated.

In the present embodiment, when viewed from a direction perpendicular to the element substrate 12, the outer perimeter of a region $R_C$ for forming the capacitor $C_S$ is arranged inside the outer perimeter of the light emitting region $R_L$. That is, the region $R_C$ for forming the capacitor $C_S$ is completely kept within the light emitting region $R_L$ of the organic EL element in plan view, and even a part of the region $R_C$ does not extend outside the light emitting region $R_L$. Therefore, the border of the light emitting region $R_L$ is located outside of the capacitor $C_S$, and even when the thin film transistor is disposed outside the light emitting region $R_L$, a wide light emitting region $R_L$ can be ensured. The region $R_C$ for forming the capacitor $C_S$ refers to a region in which the upper electrode 34 and the lower electrode 32 are opposed to each other.

When the capacitor $C_S$ is arranged inside the light emitting region $R_L$, the light emitting region $R_L$ positioned just above the capacitor $C_S$ is inclined in accordance with the uneven shape which occurs on the surface of the capacitor $C_S$.

Figure 4:
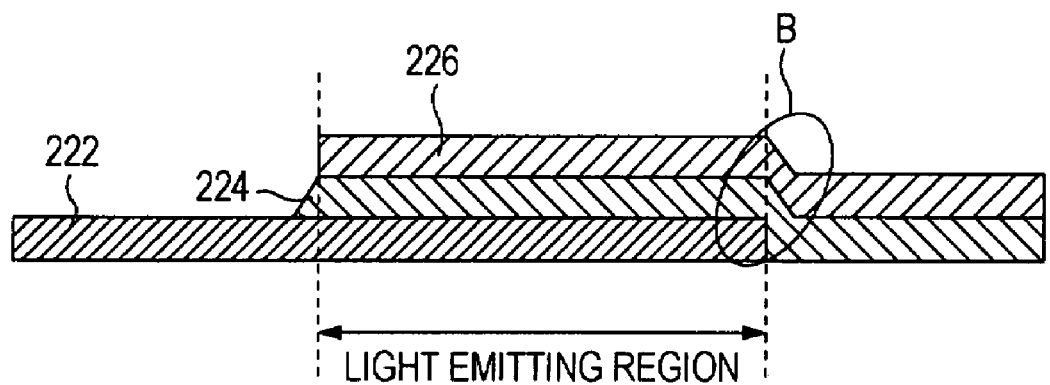
FIG. 4 is a sectional view illustrating an example of the structure of an organic EL element.

Here, for example, in the case where the organic EL element has a structure in which, as illustrated in FIG. 4, the organic layer 224 disposed between the lower electrode 222 and the upper electrode 226 covers the side portion of the lower electrode 222, the film thickness of the organic layer 224 on the side portion of the lower electrode 222 (edge region B of a light emitting region) is decreased and short circuit tends to occur between the upper electrode 226 and the lower electrode 222. Furthermore, the film thickness of the upper electrode 226 is also decreased and, as a result, a break tends to occur in the upper electrode 226. The organic EL element described in Japanese Unexamined Patent Application Publication No. 7-111341 has a similar problem. FIG. 4 is a sectional view illustrating an example of the structure of an organic EL element.

Figure 5:
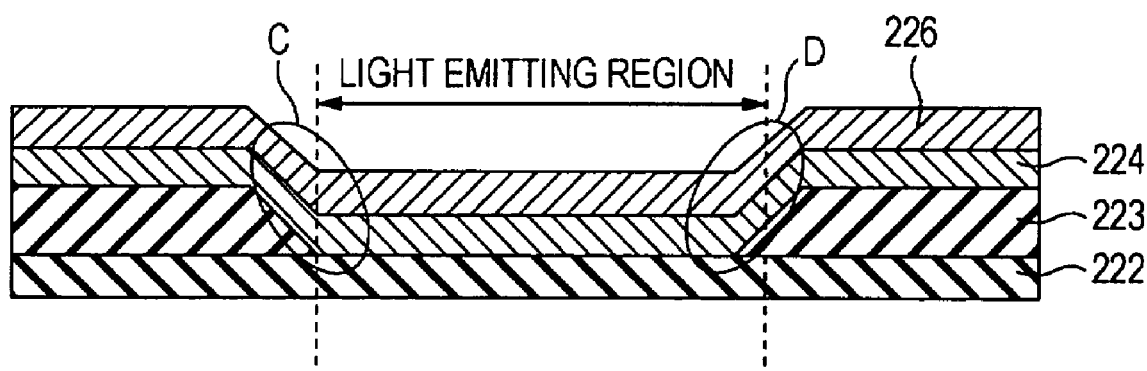
FIG. 5 is a sectional view illustrating an example of the structure of an organic EL element.

Furthermore, in the case where the organic EL element has a structure in which, as illustrated in FIG. 5, an insulating layer 223 is interposed between the lower electrode 222 and the organic layer 224 and the light emitting region is surrounded by the insulating layer 223, the film thickness of the organic layer is decreased in the edge regions C and D of the light emitting region and short circuit may occur between the upper electrode 226 and the lower electrode 222. Furthermore, the film thickness of the upper electrode 226 is also decreased in the region C and the region D and, as a result, a break may occur in the upper electrode 226. FIG. 5 is a sectional view illustrating an example of the structure of an organic EL element.

As described above, short circuit between the upper electrode 226 and the lower electrode 222 and a break in the upper electrode 226 tend to occur at the edge portion of the light emitting region $R_L$. Here, when the upper electrode 226, the organic layer 224, and the lower electrode 222 positioned at the edge portion of the above-described light emitting region $R_L$ are inclined due to the uneven shape of the surface of the capacitor $C_S$, the film thicknesses of the upper electrode 226, the organic layer 224, and the lower electrode 222 tend to be decreased at the inclinations. Therefore, short circuit between the upper electrode 226 and the lower electrode 222 and a break in the upper electrode 226 tend to occur at the edge portion of the light emitting region $R_L$.

Consequently, in the case where the capacitor $C_S$ is arranged inside the light emitting region $R_L$ of the organic EL element 104, it is preferable that a distance (a distance in a direction parallel to the element substrate 12) between the edge portion of the light emitting region $R_L$ and the edge portion of the capacitor $C_S$ be ensured larger than or equal to the thickness of one electrode containing the capacitor $C_S$ (more preferably, the distance larger than or equal to the total sum of the thicknesses of a pair of electrodes constituting the capacitor $C_S$ is ensured). In this manner, even when the upper electrode 226, the organic layer 224, and the lower electrode 222 positioned just above the height difference, which occurs at the edge portion of the capacitor $C_S$, are inclined due to the height difference, an adequate spacing may be ensured between the above-described inclined portion and the edge portion of the light emitting region $R_L$. As a result, occurrences of short circuit between the upper electrode 226 and the lower electrode 222 and break in the upper electrode 226 may decrease further satisfactorily, and an improvement of the productivity of the image display apparatus may be facilitated.

It is preferable that the capacitor $C_S$ be arranged so as to include the center position of the light emitting region $R_L$ of the organic EL element 104 in order to ensure a wide area of the capacitor $C_S$. For the same reason, it is preferable that the area of the capacitor $C_S$ be 80% or more of the area of the light emitting region $R_L$.

Therefore, the organic EL display apparatus according to the present embodiment exerts the effects of decreasing satisfactorily the occurrence of break or short circuit, which results from the position of arrangement of the thin film transistor and the capacitor, of the electrode constituting the light emitting element and realizing an organic EL display apparatus exhibiting excellent productivity.

The organic EL display apparatus according to the present embodiment can be produced by following the previously known thin film formation technology and semiconductor production technology. That is, a circuit layer including various circuits is formed on the element substrate 12 and, furthermore, the insulating layer 14 is formed on the circuit layer in order to insulate the circuit layer. Subsequently, the organic EL element 104 is formed on the insulating layer 14. However, in the present embodiment, when the circuit layer is formed, the driving thin film transistor $T_D$ and the switching thin film transistor $T_S$ are arranged outside the light emitting region $R_L$ of the organic EL element 104, and the capacitor $C_S$ is arranged inside the light emitting region $R_L$ of the organic EL element 104. In this manner, the organic EL display apparatus according to the present embodiment can be produced.

Figure 6A:
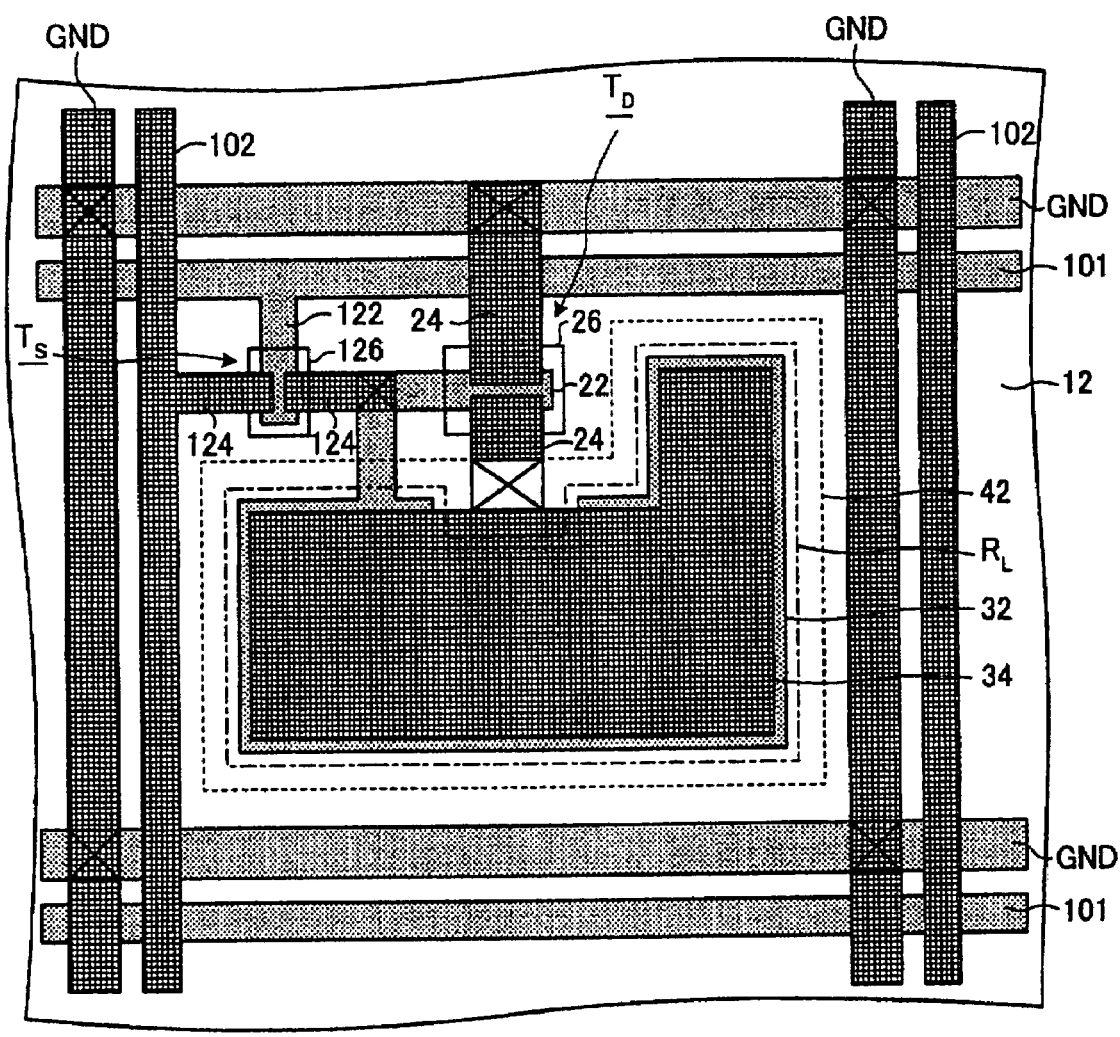
FIG. 6A is a plan view for explaining the schematic configuration of the pixel region in an organic EL display apparatus according to another embodiment.
Figure 6B:
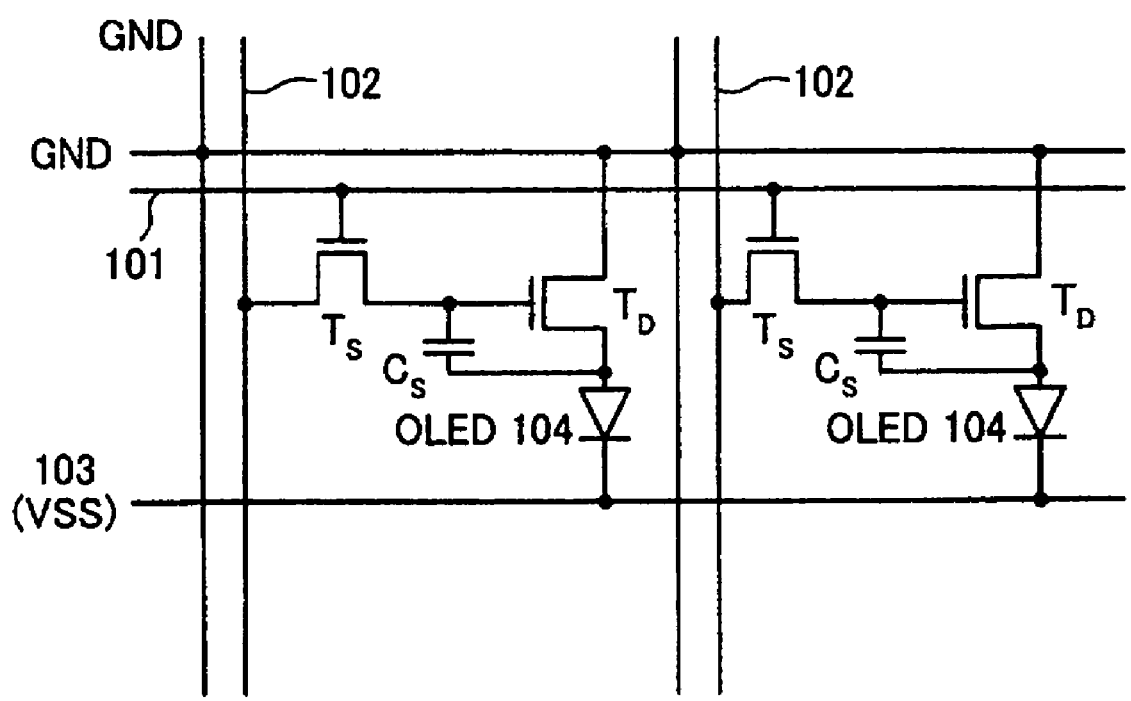
FIG. 6B is an equivalent circuit diagram of the pixel region in the organic EL display apparatus illustrated in FIG. 6A.

The present invention is not limited to the above-described embodiments, and various modifications and improvements can be made. For example, the organic EL display apparatus may be as illustrated in FIG. 6A and FIG. 6B, as a matter of course. The organic light emitting diode has been used as the light emitting element. However, the light emitting diode may be formed from a material other than the organic material, and other light emitting elements may be used. Although a bottom gate type transistor has been used in the above-described embodiments, a top gate type transistor may be used as the thin film transistor $T_S$ or the thin film transistor $T_D$.

What is claimed is:

1. An image display apparatus comprising a plurality of pixels, each of which comprises,
   a light emitting element having a light emitting region;
   a first thin film transistor arranged outside the light emitting region in plan view, for driving the light emitting element; and
   a capacitor comprising a first electrode and a second electrode including a overlapping region which overlaps with the first electrode,
   wherein the overlapping region is arranged inside the light emitting region in plan view.

2. The image display apparatus according to claim 1, wherein a part of the overlapping region is positioned below the center of the light emitting region.

3. The image display apparatus according to claim 1, wherein a distance from the edge of the capacitor to the light emitting region is not less than a thickness of one of the first electrode or the second electrode of the capacitor.

4. The image display apparatus according to claim 1, wherein each of the pixels further comprises a second thin film transistor arranged outside the light emitting region.

5. The image display apparatus according to claim 4, wherein the first thin film transistor, the second thin film transistor and the capacitor are disposed on the same plane.

6. The image display apparatus according to claim 1, further comprising a substrate which supports the pixels, wherein the capacitor is disposed between the light emitting element and the substrate.

7. The image display apparatus according to claim 6, wherein a light emitted from the light emitting region exits in a direction opposite to the capacitor.

8. The image display device according to claim 1, wherein the overlapping region is arranged just under the light emitting element.

* * * * *